(12) United States Patent
Bennett et al.

(10) Patent No.: US 8,652,959 B2
(45) Date of Patent: Feb. 18, 2014

(54) N- AND P-CHANNEL FIELD EFFECT TRANSISTORS WITH SINGLE QUANTUM WELL FOR COMPLEMENTARY CIRCUITS

(71) Applicants: Brian R. Bennett, Arlington, VA (US); John Bradley Boos, Springfield, VA (US); Mario Ancona, Alexandria, VA (US); James G. Champlain, Alexandria, VA (US); Nicolas A. Papanicolaou, Potomac, MD (US)

(72) Inventors: Brian R. Bennett, Arlington, VA (US); John Bradley Boos, Springfield, VA (US); Mario Ancona, Alexandria, VA (US); James G. Champlain, Alexandria, VA (US); Nicolas A. Papanicolaou, Potomac, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/756,566

(22) Filed: Feb. 1, 2013

(65) Prior Publication Data
US 2013/0149845 A1 Jun. 13, 2013

Related U.S. Application Data

(62) Division of application No. 13/115,453, filed on May 25, 2011, now Pat. No. 8,461,664.

(60) Provisional application No. 61/350,489, filed on Jun. 2, 2010.

(51) Int. Cl.
H01L 21/28 (2006.01)

(52) U.S. Cl.
USPC .................. 438/604; 257/E29.252; 257/615; 257/E29.251; 257/E29.254

(58) Field of Classification Search
USPC .......... 438/604; 257/615, 200, 251, 252, 254, 257/E29.251, E29.252, E29.254
See application file for complete search history.

(56) References Cited

PUBLICATIONS

R. Chau et al., "Benchmarking Nanotechnology for High-Performance and Low-Power Logic Transistor Applications," IEEE Transactions on Nanotechnology 4, 153 (2005).
B.R. Bennett et al., "Antimonide-based compound semiconductors for electronic devices: A review," Solid State Electronics 49, 1875 (2005).
R. Kiehl et al., "p-Channel FET Based on p/n Double-Quantum-Well Heterostructure," IEEE Electr. Device Lett. 10, 42 (1989).
A. Leuther et al., Complementary HFETS on GaAs with 0.2μm gate length, 26th Int'l Symp. Compound Semiconductors 1999, pp. 313-316 (2000).

(Continued)

Primary Examiner — Julio J Maldonado
Assistant Examiner — Amar Movva
(74) Attorney, Agent, or Firm — US Naval Research Laboratory; Joslyn Barritt

(57) ABSTRACT

A complementary metal oxide semiconductor (CMOS) device in which a single $In_xGa_{1-x}Sb$ quantum well serves as both an n-channel and a p-channel in the same device and a method for making the same. The $In_xGa_{1-x}Sb$ layer is part of a heterostructure that includes a Te-delta doped $Al_yGa_{1-y}Sb$ layer above the $In_xGa_{1-x}Sb$ layer on a portion of the structure. The portion of the structure without the Te-delta doped $Al_yGa_{1-y}Sb$ barrier layer can be fabricated into a p-FET by the use of appropriate source, gate, and drain terminals, and the portion of the structure retaining the Te-delta doped $Al_yGa_{1-y}Sb$ layer can be fabricated into an n-FET so that the structure forms a CMOS device, wherein the single $In_xGa_{1-x}Sb$ quantum well serves as the transport channel for both the n-FET portion and the p-FET portion of the heterostructure.

4 Claims, 5 Drawing Sheets

(56) References Cited

PUBLICATIONS

T. Tsai et al., "Characteristics of InGaP/InGaAs complementary pseudomorphic doped-channel HFETs," Solid-State Electronics 52, 146 (2008).

R. B. Brown et al., "Overview of Complementary GaAs Technology for High-Speed VLSI Circuits," IEEE Trans. on VLSI Systems, 6, 47 (1998).

G. Delhaye et al., "Metamorphic high electron mobility Te-doped AlInSb/GaInSb heterostructures on InP (001)," J. Appl. Phys. 104, 066105 (2008).

S. Datta et al., "85 nm Gate Length Enhancement and Depletion mode InSb Quantum Well Transistors for Ultra High Speed and Very Low Power Digital Logic Applications," Electron Devices Meeting, 2005, IEDM Technical Digest. IEEE International, pp. 763-766, Dec. 5, 2005.

M. Radosavljevic et al., "High-Performance 40 nm Gate Length InSb P-Channel Compressively Strained Quantum Well Field Effect Transistors for Low-Power (VCC = 0.5V) Logic Applications," IEEE International Electron Devices Meeting 2008, Technical Digest, 727.

B. R- Bennett et al., "Mobility enhancement in strained p-InGaSb quantum wells," Applied Physics Letters 91, 042104 (Jul. 23, 2007).

B. R. Bennett et al., "Strained GaSb/AlAsSb quantum wells for p-channel field-effect transistors," J. Crys. Growth 311, 47 (2008).

D. Lin et al., "Enabling the high-performance InGaAs/Ge CMOS: a common gate stack solution," IEDM 2009, 327-330 (2009).

M. G. Ancona et al. "Scaling Projections for Sb-Based p-Channel FETs," Solid-State Electronics 54, 1349-1358 (Nov. 2010).

K.F Longenbach et al., "A Complementary Heterostructure Field Effect Transistor Technology Based on InAs/AlSb/GaSb," IEEE Trans. Electron Dev. 37, p. 2265, 1990.

B. R. Bennett et al., "Mobility enhancement in strained p-InGaSb quantum wells," Appl. Phys. Lett. 91, 042104 (2007).

L. Desplanque et al., "Electronic properties of the high electron mobility $Al_{0.56}In_{0.44}Sb/Ga_{0.5}In_{0.5}Sb$ heterostructure," J. Appl. Phys. 108, 043704 (2010).

N- AND P-CHANNEL FIELD EFFECT TRANSISTORS WITH SINGLE QUANTUM WELL FOR COMPLEMENTARY CIRCUITS

CROSS-REFERENCE

This application is a divisional of and claims the benefit of priority under 35 U.S.C. §120 based on U.S. patent application Ser. No. 13/115,453 filed on May 25, 2011, which in turn is a nonprovisional of and claims the benefit of priority under 35 U.S.C. §119 based on U.S. Provisional Patent Application No. 61/350,489 filed on Jun. 2, 2010, both of which are hereby incorporated by reference into the present application in their entirety.

TECHNICAL FIELD

The present invention relates to design and fabrication of low-power complementary semiconductor heterostructures.

BACKGROUND

Complementary metal-oxide-semiconductor (CMOS) design is the key technology of mainstream digital electronics that allows ultra-high levels of integration to be achieved by greatly reducing power dissipation. Low-power complementary circuits (with or without an oxide technology) are well suited for battery-powered systems such as portable display devices and multi-element sensor networks, as well as for radio-frequency identification tags with extended operating range. Such circuits can also be critical for military technologies including analog-to-digital and digital-to-analog conversion for applications such as radar and distributed autonomous sensing and communication.

From an implementation standpoint, CMOS is superbly well served by the $Si/SiO_2$ material system. It provides nearly matching mobilities for electrons and holes and the ability to withstand high temperature processing, allowing one to fabricate the requisite n-channel and p-channel transistors within a single layer of Si simply by doping the source/drain regions (as contacts) and channels (for threshold control) appropriately.

In contrast, the III-V compound antimonide-based semiconductors are nowhere near as suitable for use in CMOS structures. If materials with different lattice constants and/or crystalline structures are used (e.g. Ge and InGaAs), then the integration becomes more complex. For example, selective regrowth of InGaAs on Ge has been envisioned, but has previously been difficult to achieve. Moreover, the electron and hole mobilities of III-V materials are markedly different, limiting their usefulness as n- and p-channel FETs in a single device. In addition, they require low-temperature processing, which greatly limits the strategies available for doping.

Nevertheless, the tremendous potential benefits for power dissipation and speed presented by the III-V semiconductors have motivated various efforts aimed at overcoming these challenges and exploring the feasibility of III-V materials for use in CMOS structures. See R. Chau et al., "Benchmarking Nanotechnology for High-Performance and Low-Power Logic Transistor Applications," *IEEE Transactions on Nanotechnology* 4, 153 (2005); B. R. Bennett et al., "Antimonide-based compound semiconductors for electronic devices: A review," *Solid State Electronics* 49, 1875 (2005); R. Kiehl et al., "p-Channel FET Based on p/n Double-Quantum-Well Heterostructure," *IEEE Electr. Device Lett.* 10, 42 (1989); A. Leuther et al., Complementary HFETS on GaAs with 0.2 µm gate length, 26th *Int'l Symp. Compound Semiconductors* 1999, pp. 313-316 (2000); T. Tsai et al., "Characteristics of InGaP/InGaAs complementary pseudomorphic doped-channel HFETs," *Solid-State Electronics* 52, 146 (2008); and R. B. Brown et al., "Overview of Complementary GaAs Technology for High-Speed VLSI Circuits," *IEEE Trans. on VLSI Systems*, 6, 47 (1998). Achieving the use of III-V materials in CMOS devices may allow microprocessors to follow Moore's Law for additional generations.

Efforts have been made to improve electron mobility in the antimonides. For example, graded buffer layers on InP substrates have been used to achieve n-channel-$In_{0.5}Ga_{0.5}Sb$ quantum wells with room-temperature mobilities of 19,000 $cm^2/V \cdot S$. See G. Delhaye et al., "Metamorphic high electron mobility Te-doped AlInSb/GaInSb heterostructures on InP (001)," *J. Appl. Phys.* 104, 066105 (2008). N-channel-InSb FETs have also been investigated, with mobilities of 25,000 $cm^2/V$-s and excellent high-frequency FET performance being achieved. See S. Datta et al., "85 nm Gate Length Enhancement and Depletion mode InSb Quantum Well Transistors for Ultra High Speed and Very Low Power Digital Logic Applications," *Electron Devices Meeting, 2005, IEDM Technical Digest. IEEE International*, pp. 763-766, 5 Dec. 2005. p-InSb-channel FETs also have been achieved. See M. Radosavljevic et al., "High-Performance 40 nm Gate Length InSb P-Channel Compressively Strained Quantum Well Field Effect Transistors for Low-Power ($V_{CC}$=0.5V) Logic Applications," *IEEE International Electron Devices Meeting* 2008, *Technical Digest*, 727.

In addition, it has previously been shown that hole mobility in the antimonides can be improved by increasing the strain in the quantum well acting as the transport channel. See B. R. Bennett, et al., "Mobility enhancement in strained p-InGaSb quantum wells," *Applied Physics Letters* 91, 042104 (23 Jul. 2007). B. R. Bennett et al., "Strained GaSb/AlAsSb quantum wells for p-channel field-effect transistors," *J. Crys. Growth* 311, 47 (2008); and M. Radosavljevic et al., supra. It may also be possible to achieve higher hole mobilities without sacrificing electron mobility by, for example, reducing the thickness of the quantum well and possibly increasing the InSb mole fraction. See B. R. Bennett et al., *Appl. Phys. Lett.*, *supra*. Other groups are pursuing InGaAs for the n-channel material and strained Ge for the p-channel material, see, e.g., D. Lin et al., "Enabling the high-performance InGaAs/Ge CMOS: a common gate stack solution," *IEDM* 2009, 327-330 (2009), but these materials have different crystalline structures and lattice constants, making their integration a significant challenge.

Ultimately, which of the antimonide-based materials turns out to be best suited for complementary logic circuit technology will depend not just on the electron and hole mobilities, but also on a host of other factors such as scalability, contact resistance, drive and leakage currents, integrability with oxides/dielectrics, and enhancement-mode capability. M. G. Ancona, et al. "Scaling Projections for Sb-Based p-Channel FETs," *Solid-State Electronics* 54, 1349-1358 (November 2010).

In previous work with GaAs, InGaAs, and InAs/GaSb channels, separate layers were grown for the n- and p-channels. See, e.g., K. F. Longenbach et al., "A Complementary Heterostructure Field Effect Transistor Technology Based on InAs/AISb/GaSb," *IEEE Trans. Electron Dev.* 37, p. 2265, 1990; and A. Leuther et al., supra.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a complementary semiconductor, for example, a complementary metal oxide semiconductor (CMOS), device in which a single modulation-doped semiconductor quantum well, such as an $In_xGa_{1-x}Sb$ quantum well, serves as both an n-channel and a p-channel in the same device. The $In_xGa_{1-x}Sb$ quantum well layer is part of a heterostructure that includes a Te-delta doped $Al_wGa_{1-w}Sb$ layer, the $In_xGa_{1-x}Sb$ quantum well layer being clad by an $Al_yGa_{1-y}Sb$ barrier layer and an $Al_zGa_{1-z}Sb$ buffer/barrier layer, and the Te-delta doped $Al_wGa_{1-w}Sb$ layer being clad by $In_uAl_{1-u}Sb$ and $In_vAl_{1-v}Sb$ barriers layers. When the Te-delta doped $Al_wGa_{1-w}Sb$ layer and the $In_uAl_{1-u}Sb$ layer are not present in a portion of the structure, e.g., are etched away from a portion of the structure, the portion of the structure without the Te-delta doped $Al_wGa_{1-w}Sb$ layer can be fabricated into a p-FET by the use of appropriate source, gate, and drain terminals, and the portion of the structure retaining the Te-delta doped $Al_wGa_{1-w}Sb$ layer can be fabricated into an n-FET so that the structure forms a CMOS device, wherein the single $In_xGa_{1-x}Sb$ quantum well serves as the transport channel for both the n-FET portion and the p-FET portion of the heterostructure. In other embodiments, $In_uGa_vAl_{1-v-u}Sb$ can be used for all the barrier layers.

In an exemplary embodiment of a structure according to the present invention, u=0.2, v=0.2, w=0.8, x=0.2, y=0.8, and z=0.8 so that the CMOS device has a layer structure as follows: $In_{0.2}Ga_{0.8}Sb$ barrier layer, Te-doped $Al_{0.8}Ga_{0.2}Sb$ barrier layer, $In_{0.2}Al_{0.8}Sb$ barrier layer, $Al_{0.8}Ga_{0.2}Sb$ barrier layer, $In_{0.2}Ga_{0.8}Sb$ quantum well layer, and $Al_{0.8}Ga_{0.2}Sb$ barrier/buffer layer.

The present invention also includes methods for forming a CMOS device having a single —$In_xGa_{1-x}Sb$ quantum well serving as the transport channel for both the n-FET and the p-FET.

In a first embodiment of a method for forming a CMOS device having a single $In_xGa_{1-x}Sb$ quantum well, a Te-delta doped $Al_wGa_{1-w}Sb$ layer is disposed on a heterostructure including the $In_xGa_{1-x}Sb$ quantum well and one or more suitable barrier/buffer layers and removing Te-delta doped $Al_wGa_{1-w}Sb$ layer from a portion of the heterostructure to form a p-FET on the portion of the heterostructure where the Te-delta doped $Al_wGa_{1-w}Sb$ layer is removed, with the portion of the structure where the Te-delta doped $Al_wGa_{1-w}Sb$ layer remains forming an n-FET.

In a second embodiment of a method for forming a CMOS device having a single $In_xGa_{1-x}Sb$ quantum well, a Te-delta doped $Al_wGa_{1-w}Sb$ layer is disposed (e.g., via epitaxial regrowth) on a portion of a heterostructure including the $In_xGa_{1-x}Sb$ quantum well and one or more suitable barrier/buffer layers to form an n-FET on the portion of the heterostructure where the Te-delta doped $Al_wGa_{1-w}Sb$ layer is disposed, with the remainder of the structure forming a p-FET.

BRIEF DESCRIPTION OF THE DRAWINGS

FIG. 2A shows the energy band structure for an $In_{0.2}Ga_{0.8}Sb$ quantum well clad with $Al_{0.8}Ga_{0.2}Sb$. FIG. 2B shows the energy band structures for the same heterostructure but with a Te-doped layer disposed above the quantum well in accordance with the present invention.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

For example, although the present invention is described herein in the context of a complementary metal oxide semiconductor (CMOS) device, one skilled in the art would readily understand that aspects described herein can be used to provide a more general type of complementary semiconductor device without oxides. In addition, although the invention is described in terms of having a Te-delta doped material layer, layers having other appropriate forms of doping, e.g., standard modulation doping or direct doping of the channel, can also be used to form a complementary semiconductor device in accordance with the present invention. It would further be understood by one skilled in the art that the layer thicknesses described herein are merely exemplary, and that a device in accordance with the present invention can be fabricated with materials having other appropriate thicknesses as well.

Thus, in an exemplary embodiment, the present invention provides a complementary metal oxide semiconductor (CMOS) device in which a single modulation-doped semiconductor quantum well, such as an $In_xGa_{1-x}Sb$ quantum well, serves as both an n-channel and a p-channel in the same device.

Figure 1:
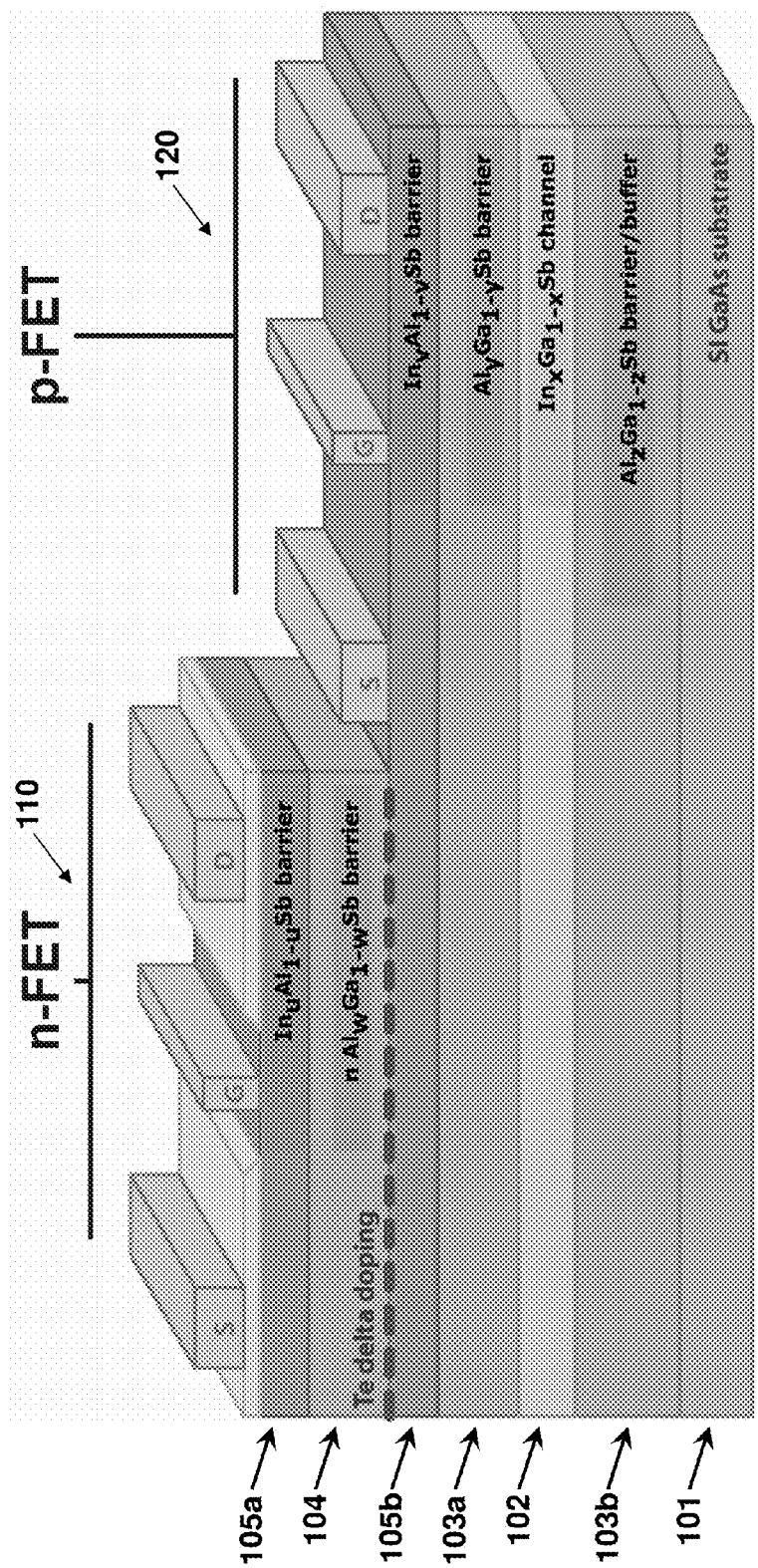
FIG. 1 depicts a general exemplary configuration of a CMOS device having a single $In_xGa_{1-x}Sb$ quantum well serving as the transport channel for both the n-FET and the p-FET in accordance with the present invention.

An exemplary CMOS device comprising a heterostructure having a single $In_xGa_{1-x}Sb$ quantum well is illustrated in FIG. 1. As shown in FIG. 1, a CMOS device in accordance with the present invention includes a substrate such as a semi-insulating (SI) GaAs substrate 101, $In_xGa_{1-x}Sb$ quantum well layer 102 clad by $Al_zGa_{1-z}Sb$ barrier/buffer layer 103a and $Al_yGa_{1-y}Sb$ barrier 103b, and further includes a Te-delta doped $Al_wGa_{1-w}Sb$ layer 104 disposed above the $In_xGa_{1-x}Sb$ quantum well, Te-delta doped $Al_wGa_{1-w}Sb$ layer 104 being clad by $In_uAl_{1-u}Sb$ barrier layer 105a and $In_vAl_{1-v}Sb$ barrier layer 105b. In accordance with the present invention, $In_xGa_{1-x}Sb$ quantum well layer 102 is modulation doped by the Te doping in $Al_wGa_{1-w}Sb$ layer 104. When AlGaSb is Te-doped to a sufficient degree, it becomes n-type and electrons transfer into the $In_xGa_{1-x}Sb$ quantum well. A structure having such a Te-doped AlGaSb layer among the other described layers functions as an n-type semiconductor that can support fabrication of an n-FET. In contrast, without the Te-delta doping, AlGaSb structures are normally p-type, and so a structure having only an undoped AlGaSb layer functions as a p-type semiconductor that can support fabrication of a p-FET. If higher p-type doping is needed, the AlGaSb (or InAlSb) layers can be doped with elements such as Be.

The present invention takes advantage of this characteristic of a heterostructure having both doped and undoped AlGaSb. In one embodiment of a CMOS structure in accordance with the present invention, $In_uAl_{1-u}Sb$ barrier layer 105a and Te-delta doped $Al_wGa_{1-w}Sb$ layer 104 are removed from a portion of the structure, for example by etching. An alternative way to integrate the n-type and p-type FET with a single channel is grow the structure shown in FIG. 1 up to and including InAlSb upper barrier layer 105b, and then continue to grow (only in selected regions) the n-type AlGaSb barrier layer with Te doping layer 104 and InAlSb barrier layer 105a. In either case, as a result, the structure contains two portions, one functioning as an n-type semiconductor and the other functioning as a p-type. The portion of the structure where $In_uAl_{1-u}Sb$ barrier layer 105a and Te-delta doped $Al_wGa_{1-w}Sb$ layer 104 remain can form n-FET 110 when appropriate source, gate, and drain terminals are added, with the $In_xGa_{1-x}Sb$ quantum well layer serving as an electron transport channel, while the portion of the structure where $In_uAl_{1-u}Sb$ barrier layer 105a and Te-delta doped $Al_wGa_{1-w}Sb$ layer 104 are removed can form a p-FET 110, with the same $In_xGa_{1-x}Sb$ quantum well layer serving as a hole transport channel. Thus, in accordance with the present invention, a CMOS device can be fabricated using a single $In_xGa_{1-x}Sb$ layer serving as the transport channel for both the n- and p-FET portions of the device.

Figure 2A:
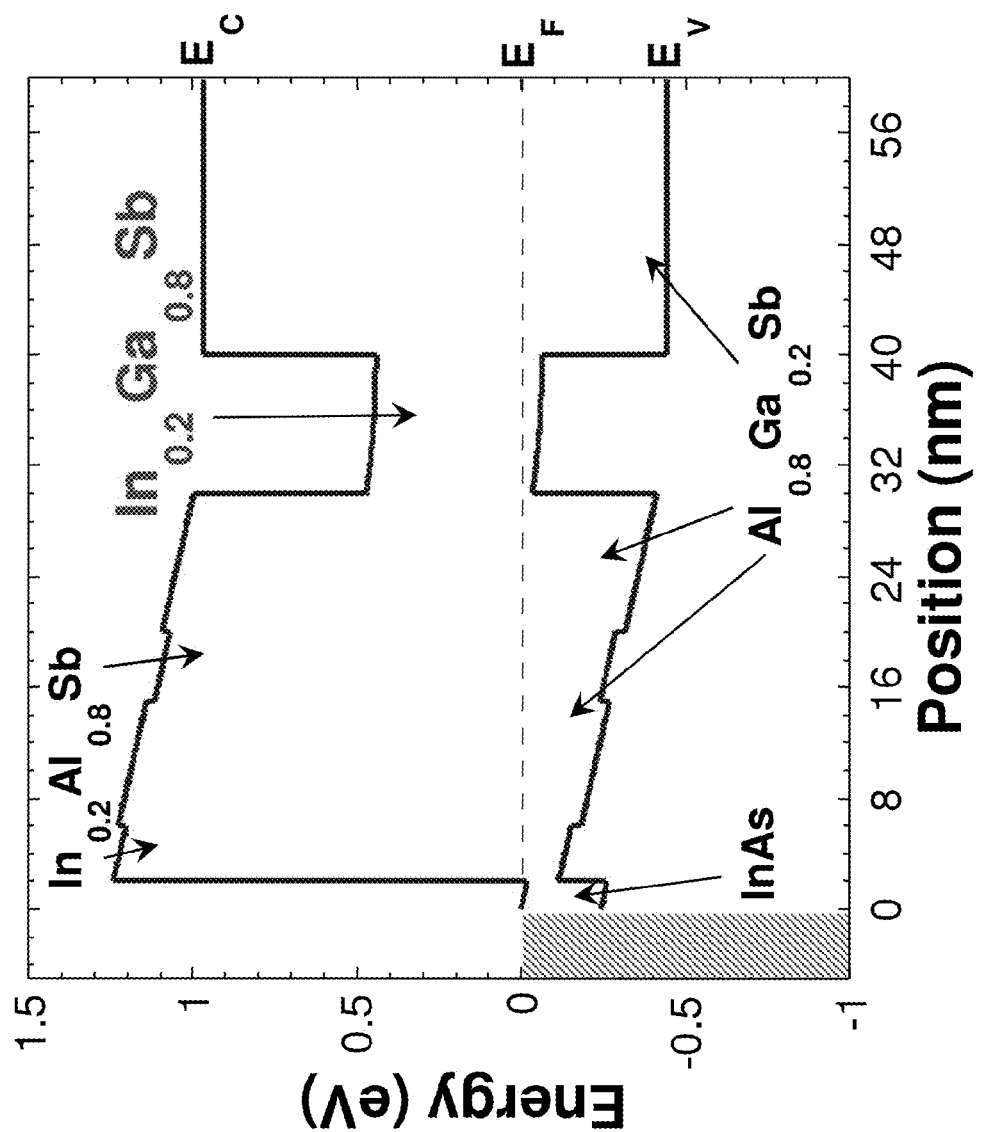
FIGS. 2A and 2B are plots depicting the calculated energy band structures for InGaSb used as a channel material for both electrons and holes.
Figure 2B:
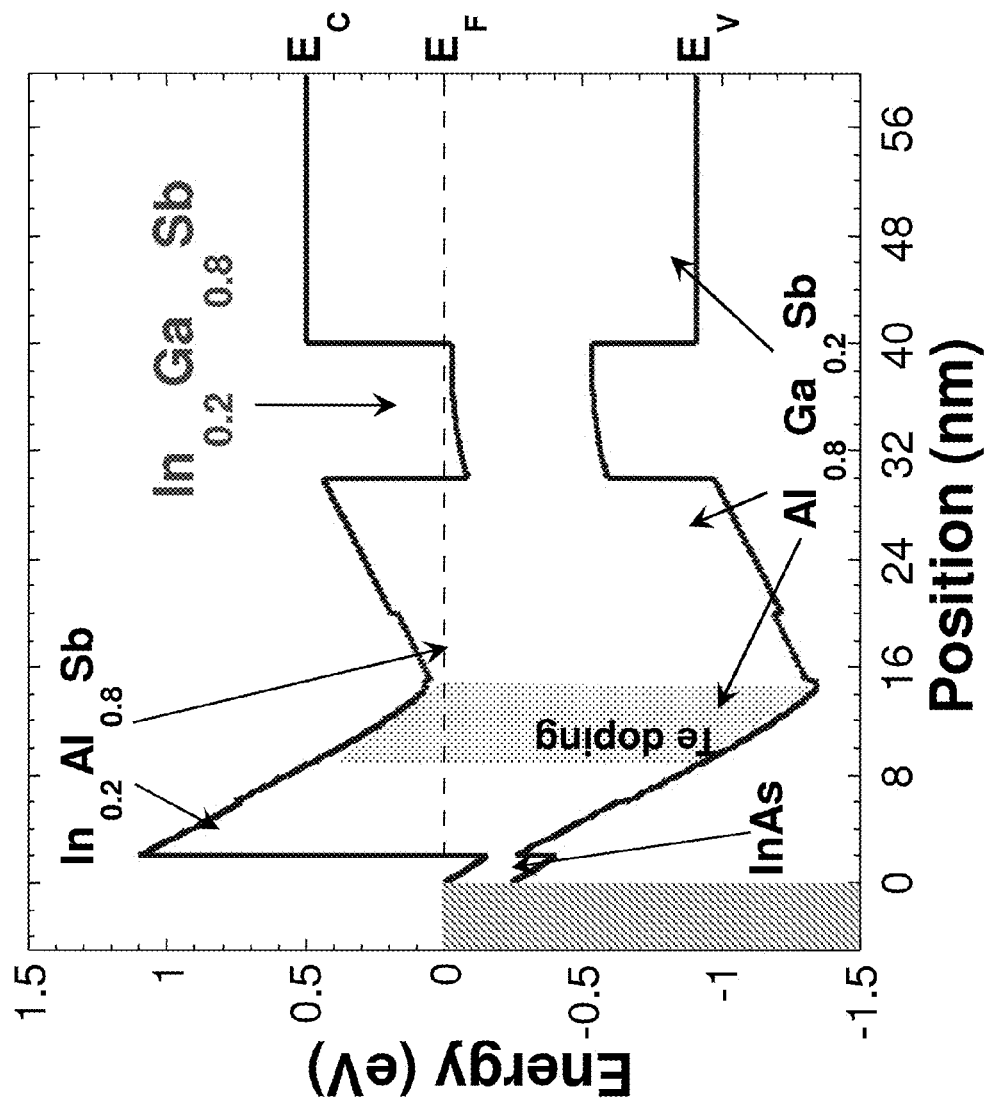

The CMOS design in accordance with the present invention illustrated in FIG. 1 and described above resulted from the inventors' investigation of InGaSb as a channel material for both electron and holes following their successful strain enhancement of hole mobilities in the antimonides referenced above. FIGS. 2A and 2B depict the results of the inventors' evaluation of electron and hole transport in InGaSb.

FIG. 2A is a plot of the calculated band structure for a 10 μm quantum well of $In_{0.2}Ga_{0.8}Sb$ clad with $Al_{0.8}Ga_{0.2}Sb$. The calculation assumed no extrinsic doping of the heterostructure. FIG. 2A shows a 0.4 eV valence band offset which should be sufficient to confine holes in the InGaSb. The position of the Fermi level $E_F$ indicates that the structure should be p-type at zero bias, and the inventors' experimental results were consistent with this: hole sheet densities near $7 \times 10^{11}/cm^2$ for unintentionally doped InGaSb quantum wells. See B. R. Bennett et al., "Mobility enhancement in strained p-InGaSb quantum wells," *Appl. Phys. Lett.* 91, 042104 (2007).

FIG. 2B is a plot showing the energy band diagrams for the same structure but having n-type (Te) doping introduced above the quantum well. This structure was not studied experimentally heretofore. FIG. 2B further indicates that the InGaSb/AlGaSb structure has a large conduction band offset, allowing for the confinement of electrons in the InGaSb well. As shown in FIG. 2B, the Fermi level of such a modified structure indicates the structure should be n-type at zero bias, with a conduction band offset of 0.5 eV.

Thus, the inventors concluded that by Te-doping and selectively removing layers, e.g., by chemical etching, or by selectively adding layers, e.g. by selective regrowth, a single modulation-doped $In_xGa_{1-x}Sb$ layer in a heterostructure could function as both a p-type and an n-type material. This would allow an n-FET adjacent to a p-FET without complexities such as selective epitaxial regrowth.

Figure 3:
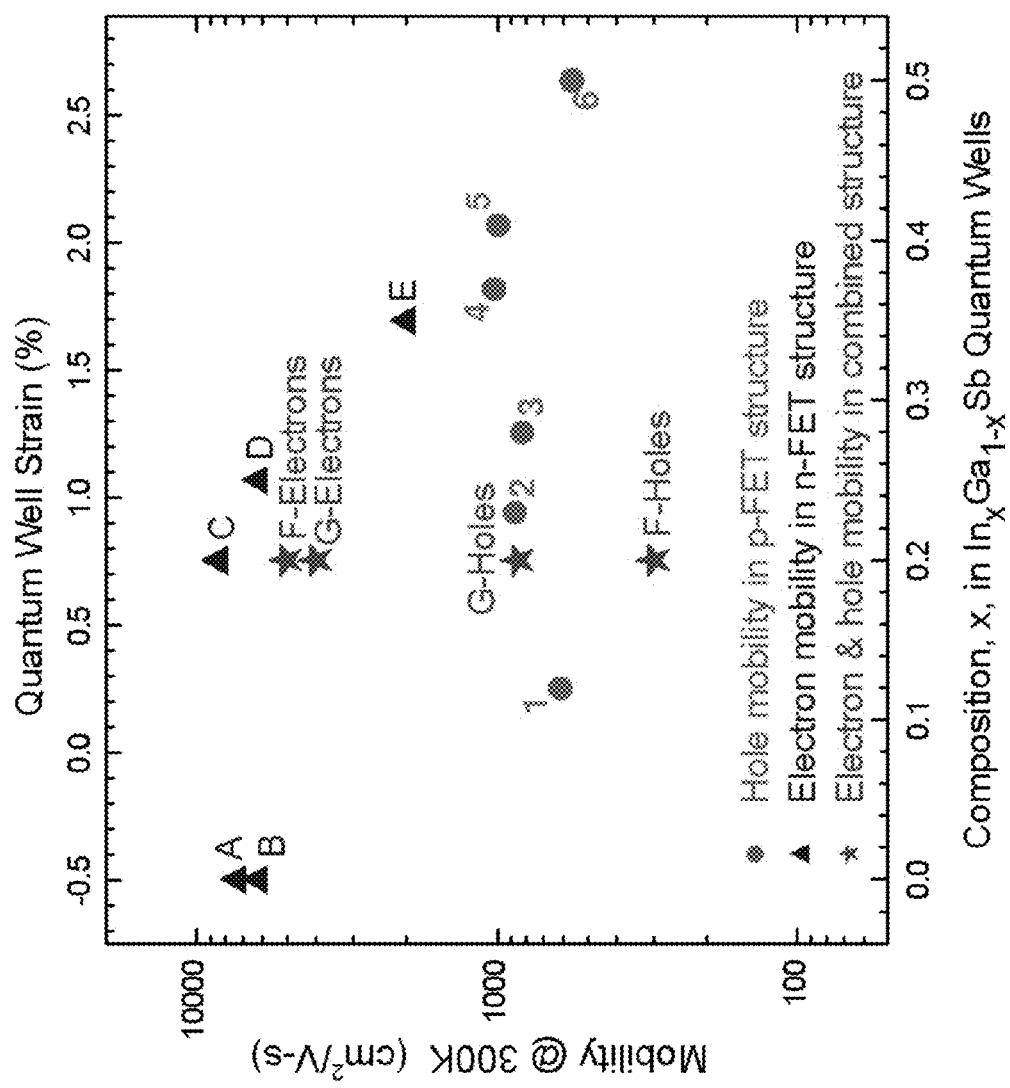
FIG. 3 is a plot showing the hole mobilities for various heterostructures having $In_xGa_{1-x}Sb$ quantum well transport channels and $Al_yGa_{1-y}Sb$ buffer layers in accordance with the prior art and electron and hole mobilities for various heterostructures having an additional Te-doped layer in accordance with the present invention.

The plots shown in FIG. 3 illustrate electron mobility as a function of the mole fraction x for the $In_xGa_{1-x}Sb$ channel for five samples, labeled A-E. The sheet concentrations in all cases were $4-5 \times 10^{11}/cm^2$. The hole mobilities for $In_xGa_{1-x}Sb$ from the inventors' earlier work, see B. R. Bennett et al., *Appl. Phys. Lett., supra*, are also plotted in FIG. 3 as a function of the mole fraction x, and are denoted by the solid circles labeled 1-6. For all samples, the buffer layer was 1.5 μm $Al_yGa_{1-y}Sb$ with y=0.70-0.80.

As x increases, the lattice constant of the $In_xGa_{1-x}Sb$ grows, resulting in channels with increasing compressive strain. For example, the strains for $In_{0.2}Ga_{0.8}Sb$ (sample C) and $In_{0.4}Ga_{0.6}Sb$ (sample E) are 0.73% and 1.98%, respectively. If the lattice mismatch is too large, however, misfit dislocations will form to relieve the strain and cause a significant decrease in electron and hole mobilities (samples E and 6 in FIG. 3). The highest electron mobility (8400 $cm^2/V$-s) is achieved for sample C, with x=0.2. Increasing the mole fraction x beyond 0.2 significantly decreases electron mobility, with Sample E, with x=0.35, exhibiting an electron mobility of only 2000 $cm^2/V$-s.

In contrast, as illustrated in FIG. 3, hole mobilities for the $In_xGa_{1-x}Sb$ channel exhibit much less variation with the mole fraction x. As can be seen from FIG. 3, although the highest hole mobilities (1000 $cm^2/V$-s) are obtained for $In_xGa_{1-x}Sb$ alloys with x ~0.4 (Samples 4 and 5), the hole mobility is nearly as high for $In_xGa_{1-x}Sb$ alloys with x ~0.2 (Samples 2 and 3).

Based on the electron and hole mobilities for $In_xGa_{1-x}Sb$ as shown in FIG. 3, the inventors have identified $In_{0.2}Ga_{0.8}Sb$ as a preferred composition for the channel material. Alternatively, one could use graded buffer layers and channels of, for example, $In_{0.5}Ga_{0.5}Sb$. See, e.g., L. Desplanque et al., "Electronic properties of the high electron mobility $Al_{0.56}In_{0.44}Sb/Ga_{0.5}In_{0.5}Sb$ heterostructure," *J. Appl. Phys.* 108, 043704 (2010)

Figure 4:
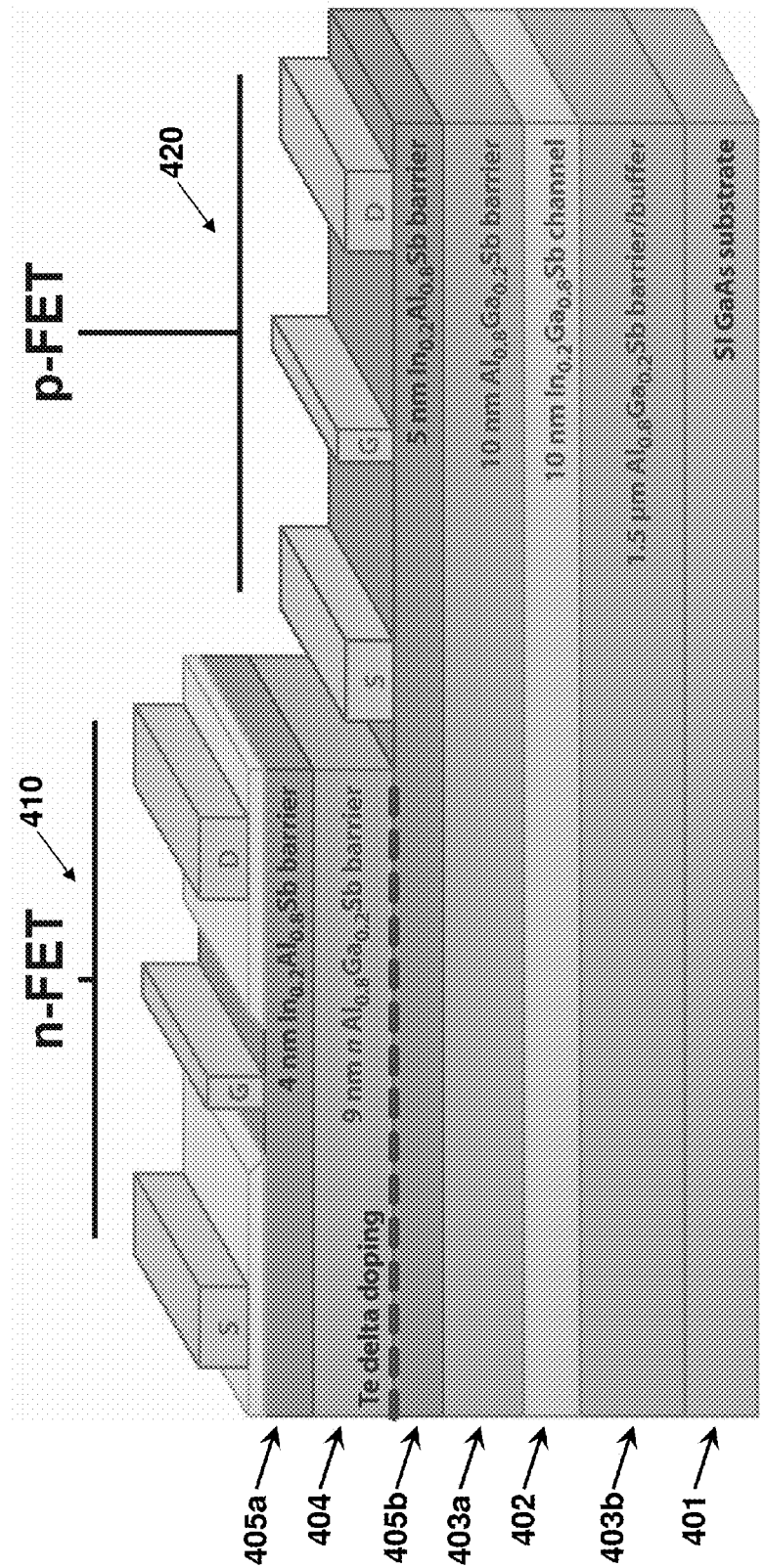
FIG. 4 depicts an exemplary embodiment of a CMOS device having a single $In_{0.2}Ga_{0.8}Sb$ quantum well serving as the transport channel for both the n-FET and the p-FET in accordance with the present invention

An exemplary embodiment of a CMOS device in accordance with the present invention is shown in FIG. 4. This heterostructure design also corresponds to the band structures in FIGS. 2A and 2B.

Such a CMOS device can include a semi-insulating (SI) GaAs substrate 401, a 10 nm $In_{0.2}Ga_{0.8}Sb$ channel 402 clad by a 10 nm $Al_{0.8}Ga_{0.2}Sb$ bather layer 403a and 1.5 μm $Al_{0.8}Ga_{0.2}Sb$ barrier/buffer layer 403b and, and a 9 nm Te-delta-doped $Al_{0.8}Ga_{0.2}Sb$ layer 404 clad by 4 nm $In_{0.2}Al_{0.8}Sb$ barrier layer 404a and 5 nm $In_{0.2}Al_{0.8}Sb$ barrier layer 304a disposed above the $Al_{0.8}Ga_{0.2}Sb$-clad $In_{0.2}Ga_{0.8}Sb$ channel.

In accordance with the present invention, Te-delta doped $Al_{0.8}Ga_{0.2}Sb$ layer 404 and 4 μm $In_{0.2}Al_{0.8}Sb$ bather layer 404a are present only on a portion of the structure. The presence of Te-delta doped $Al_{0.8}Ga_{0.2}Sb$ layer 404 serves to modulation dope the portion of $In_{0.2}Ga_{0.8}Sb$ channel 402 located under Te-delta doped $Al_{0.8}Ga_{0.2}Sb$ layer 404, and thus, the portion of the structure where Te-delta doped $Al_{0.8}Ga_{0.2}Sb$ layer 404 and 5 nm $In_{0.2}Al_{0.8}Sb$ barrier layer 305a are present forms n-FET 410 while the portion of the structure where Te-delta doped $Al_{0.8}Ga_{0.2}Sb$ layer 304 and 5 nm $In_{0.2}Al_{0.8}Sb$ barrier layer 405a are not present forms p-FET 420. Together, the n-FET and p-FET portions of the heterostructure form a CMOS device wherein the single $In_{0.2}Ga_{0.8}Sb$ channel 402 serves as a electron transport channel in the n-FET portion and as a hole transport channel in the p-FET portion of the device.

In alternative embodiments of a CMOS device in accordance with the present invention, a single quantum well layer of other modulation-doped semiconductor materials, such as (In)GaN/AlGaN, InGaAs/AlGaAs, or InGaAs/InAlAs, can also function as both an n-type and a p-type channel in the CMOS device so long as the conduction and valence band offsets of the material used are sufficient to confine electrons and holes.

The present invention also includes methods for forming a CMOS semiconductor heterostructure in which a single modulation-doped semiconductor quantum well layer can form both an n-type and a p-type channel in the device.

In a first embodiment of a method for forming a CMOS device having a single $In_xGa_{1-x}Sb$ quantum well, using the exemplary structure shown in FIG. 4 as illustrative, a heterostructure comprising a semi-insulating (SI) GaAs substrate 401, a 10 μm $In_{0.2}Ga_{0.8}Sb$ channel 402 clad by a 10 μm $Al_{0.8}Ga_{0.2}Sb$ barrier layer 403a and 1.5 μm $Al_{0.8}Ga_{0.2}Sb$ barrier/buffer layer 403b, and a 9 nm Te-delta doped $Al_{0.8}Ga_{0.2}Sb$ layer 404 clad by 4 μm $In_{0.2}Al_{0.8}Sb$ bather layer 404a and 5 nm $In_{0.2}Al_{0.8}Sb$ barrier layer 404b disposed above the $Al_{0.8}Ga_{0.2}Sb$-clad $In_{0.2}Ga_{0.8}Sb$ channel is formed, e.g., by molecular beam epitaxy or any other suitable method. Once the heterostructure described above is formed, 4 μm $In_{0.2}Al_{0.8}Sb$ barrier layer 404a and Te-doped $Al_{0.8}Ga_{0.2}Sb$ layer 404 can be removed from a portion of the structure, for example by etching.

Thus, as shown in FIG. 4, $In_{0.2}Al_{0.8}Sb$ barrier layer 405a and Te-delta doped $Al_{0.8}Ga_{0.2}Sb$ layer 404 can be removed from a portion of the structure. The portion of the structure where $In_{0.2}Al_{0.8}Sb$ barrier layer 405a and Te-delta doped $Al_{0.8}Ga_{0.2}Sb$ layer 404 are removed forms p-FET 420 and the remaining portion of the structure that includes $In_{0.2}Al_{0.8}Sb$ bather layer 405a and Te-delta doped $Al_{0.8}Ga_{0.2}Sb$ layer 404 forms n-FET 410, with $In_{0.2}Ga_{0.8}Sb$ quantum well channel 402 serving as the transport channel for both portions of the structure, i.e., for electrons in n-FET 410 and for holes in p-FET 420.

In a second embodiment of a method for forming a CMOS device having a single modulation-doped semiconductor quantum well in accordance with the present invention, using the embodiment shown in FIG. 4 as illustrative, a Te-delta doped $Al_{0.8}Ga_{0.2}Sb$ layer 404 is disposed (e.g., via epitaxial regrowth) on a portion of a heterostructure that includes a single $In_{0.2}Ga_{0.8}Sb$ quantum well channel 402 and one or more suitable barrier/buffer layers 403a/403b to form n-FET 410 on the portion of the heterostructure where the Te-delta doped $Al_{0.8}Ga_{0.2}Sb$ layer 404 is disposed, with the remainder of the structure forming p-FET 420.

In other embodiments, Be doping below the InGaSb well could also be added to obtain higher hole density. In still other embodiments, the thickness of the upper barrier layers could be reduced to decrease the gate-to-channel thickness and facilitate FETs with very short gate lengths, while incorporation of suitable dielectrics could permit extremely thin barrier layers with low leakage currents.

Following the design illustrated in FIG. 4, the inventors grew several such structures. Results for two of them, denoted as samples F and G, are plotted in FIG. 3. The first sample, sample F, did not include 5 μm $In_{0.2}Al_{0.8}Sb$ layer 405b immediately below Te-delta doped $Al_{0.8}Ga_{0.2}Sb$ layer 404. As shown in FIG. 2, the electron mobility for Sample F was 5000 $cm^2/V·s$. After the top layers were removed by wet chemical etching, the quantum well for this Sample F switched to p-type as desired, but the hole mobility was quite low, only about 300 $cm^2/V·s$. A similar result was obtained when the upper layers were removed from sample C.

However, when 5 μm $In_{0.2}Al_{0.8}Sb$ layer 405b below Te-delta doped $Al_{0.8}Ga_{0.2}Sb$ layer 404 was present (Sample G), the hole mobility improved significantly while the electron mobility decreased only slightly. As shown in FIG. 3, transport measurements for Sample G yielded an electron mobility of 3900 $cm^2/V·s$ and a density of $0.9×10^{11}/cm^2$ as grown. After removal of about 14 μm of material from Sample G, the sample was p-type with a hole density of $1.0×10^{11}/cm^2$ and a mobility of 820 $cm^2/V·s$. Removal of an additional 2 μm of material resulted in little change: $0.9×10^{11}/cm^2$ and 760 $cm^2/V·s$.

The improvement of hole mobility from sample F to sample G could result from there being less scattering from surface states of InAlSb compared to AlGaSb. The relatively low sheet carrier densities do not necessarily imply low current drive. Advanced designs including heavily-doped cap layers and selective regrowth could be used to emulate Si-based CMOS technology.

Thus, as described herein, a CMOS heterostructure can be easily formed in which a single modulation-doped semiconductor quantum well layer can serve as the transport channel for electrons in the n-FET and for holes in the p-FET forming the CMOS.

Advantages and New Features

Compared to earlier work on complementary III-V FETs described above, the hole mobility achieved in accordance with the present invention is a factor of two to four higher because of the material (InGaSb) and the use of strain to reduce the hole effective mass. To the inventors' knowledge, this is the first demonstration using the same channel for the n- and p-type III-V quantum wells.

Although particular embodiments, aspects, and features have been described and illustrated, one skilled in the art would readily appreciate that the invention described herein is not limited to only those embodiments, aspects, and features but also contemplates any and all modifications within the spirit and scope of the underlying invention described and claimed herein, and such combinations and embodiments are within the scope of the present disclosure.

What is claimed is:

1. A method for forming a complementary semiconductor device having a single quantum well layer serving as a transport channel for both holes and electrons, comprising:
   forming a heterostructure comprising a single quantum well layer and a doped barrier layer; and
   removing the doped barrier layer from a portion of the heterostructure;
   wherein the portion of the heterostructure where the doped barrier layer is removed forms a p-FET and the portion of the heterostructure where the doped barrier layer is not removed forms an n-FET, the p-FET and the n-FET forming a complementary device; and
   wherein the single quantum well layer serves as a hole transport channel for the p-FET and as an electron transport channel for the n-FET in the complementary semiconductor device.

2. A method for forming a complementary semiconductor device having a single quantum well layer serving as a transport channel for both holes and electrons, comprising:
   forming a heterostructure comprising a single quantum well layer and a doped barrier layer, the doped barrier layer being formed on only a portion of the hetero structure;
   wherein the portion of the heterostructure on which the doped barrier layer is formed comprises an n-FET and the portion of the heterostructure on which the doped barrier layer is not formed comprises a p-FET, the n-FET and the p-FET forming a complementary semiconductor device; and wherein the single quantum well layer serves as a hole transport channel for the p-FET and as an electron transport channel for the n-FET in the complementary semiconductor device.

3. A method for forming a complementary semiconductor device having a single $In_xGa_{1-x}Sb$ quantum well layer serving as a transport channel for both holes and electrons, comprising:

forming an $Al_zGa_{1-z}Sb$ layer on a substrate;

forming an $In_xGa_{1-x}Sb$ quantum well layer on the $Al_zGa_{1-z}Sb$ layer;

forming an $Al_yGa_{1-y}Sb$ layer on the $In_xGa_{1-x}Sb$ quantum well layer;

forming an $In_vAl_{1-v}Sb$ layer on the $Al_yGa_{1-y}Sb$ layer;

forming a Te-delta doped $Al_wGa_{1-w}Sb$ layer on the $In_vAl_{1-v}Sb$ layer; and forming an $In_uAl_{1-u}Sb$ layer on the Te-delta doped $Al_wGa_{1-w}Sb$ layer;

selectively removing the $In_uAl_{1-u}Sb$ layer and the Te-delta doped $Al_wGa_{1-w}Sb$ layer from a portion of the heterostructure, the portion of the heterostructure where the $In_uAl_{1-u}Sb$ layer and the Te-delta doped $Al_wGa_{1-w}Sb$ layer is removed forming a p-FET and the portion of the heterostructure where the $In_uAl_{1-u}Sb$ layer and the Te-delta doped $Al_wGa_{1-w}Sb$ layer is not removed forming an n-FET, the p-FET and the n-FET forming a complementary semiconductor device;

wherein the single $In_xGa_{1-x}Sb$ quantum well layer serves as a hole transport channel for the p-FET and as an electron transport channel for the n-FET in the complementary semiconductor device.

4. A method for forming a complementary semiconductor device having a single $In_xGa_{1-x}Sb$ quantum well layer serving as a transport channel for both holes and electrons, comprising:

forming an $Al_zGa_{1-z}Sb$ layer on a substrate;

forming an $In_xGa_{1-x}Sb$ quantum well layer on the $Al_zGa_{1-z}Sb$ layer;

forming an $Al_yGa_{1-y}Sb$ layer on the $In_xGa_{1-x}Sb$ quantum well layer;

forming an $In_vAl_{1-v}Sb$ layer on the $Al_yGa_{1-y}Sb$ layer;

forming a Te-delta doped $Al_wGa_{1-w}Sb$ layer on a portion of the $In_vAl_{1-v}Sb$ layer; and forming an $In_uAl_{1-u}Sb$ layer on the Te-delta doped $Al_wGa_{1-w}Sb$ layer;

the portion of the hetero structure on which the $In_uAl_{1-u}Sb$ layer and the Te-delta doped $Al_wGa_{1-w}Sb$ layer is formed comprising an n-FET, and another portion of the heterostructure on which the $In_uAl_{1-u}Sb$ layer and the Te-delta doped $Al_wGa_{1-w}Sb$ layer is not formed comprising a p-FET, the n-FET and the p-FET forming a complementary semiconductor device;

wherein the single $In_xGa_{1-x}Sb$ quantum well layer serves as a hole transport channel for the p-FET and as an electron transport channel for the n-FET in the complementary semiconductor device.

* * * * *